United States Patent
Huang

(10) Patent No.: US 7,261,431 B2
(45) Date of Patent: Aug. 28, 2007

(54) FAN FRAME

(75) Inventor: Tai-Chi Huang, Taipei (TW)

(73) Assignee: Dynaeon Industrial Co., Ltd., Taipei (TW)

( * ) Notice: Subject to any disclaimer, the term of this patent is extended or adjusted under 35 U.S.C. 154(b) by 66 days.

(21) Appl. No.: 11/326,019

(22) Filed: Jan. 5, 2006

(65) Prior Publication Data
US 2007/0153552 A1     Jul. 5, 2007

(51) Int. Cl.
*F21V 131/30*     (2006.01)
(52) U.S. Cl. .............................. 362/96; 362/656; 416/5
(58) Field of Classification Search ................. 362/96, 362/253, 655, 656, 391; 416/5
See application file for complete search history.

(56) References Cited

U.S. PATENT DOCUMENTS

| 7,055,977 B2* | 6/2006 | Lai ................................ 362/96 |
| 2005/0180867 A1* | 8/2005 | Takahashi et al. ...... 417/423.14 |

* cited by examiner

*Primary Examiner*—Laura Tso

(57) ABSTRACT

A fan frame, which embodies a blade assembly and a motor therein, has at least one LED socket mounted on a side thereof and having a hole and at least one set of snapping retention extended from both sides of the hole, and at least one light emitting diode mounted in its corresponding LED socket, wherein at least one set of snapping retention clips the rear portion of the light emitting diode after it is inserted into the hole.

5 Claims, 5 Drawing Sheets

FAN FRAME

BACKGROUND OF THE INVENTION

1. Field of the Invention

The present invention relates generally to a fan frame, in particular to a fan frame having at least one LED socket for mounting a light emitting diode (LED), wherein when the LED emits light onto a surface of a blade assembly of a rotating fan, the blade assembly reflects the light with a sparkling effect. There is no sparkling light effect when the blade assembly does not rotate, and it reminds users that the fan may be not functioning.

2. The Prior Arts

A fan frame is embodied with a blade assembly and a motor therein which can generate airflow to dissipate the heat of electronic products, such as computers. Therefore, inspecting whether the installed fan of an electronic product is properly working has gradually become important. The inspection method includes visual inspection, physical feeling of airflow, and monitoring power indicator and fan rotation indicator. However, the methods of visual inspection and feeling airflow physically are not suitable for the fan installed deep inside electronic products or mounted in high, far or inner positions. Furthermore, although the methods of power indicator and fan rotation indicator are not affected by the position of fan, the working status of the fan cannot be accurately observed if the power indicator and the fan rotation indicator are normal but the fan is failed or short-circuited.

To improve the disadvantages of the above-mentioned inspection methods for fan working status, a conventional fan frame 100, which is shown in FIGS. 1 and 2, has a hole 101 formed on a side of the fan frame 100 for inserting a light emitting diode (LED) 102. The pin wires 103 in a rear end of the LED are connected to a lead wire 105 and then bended and embedded in a guiding slot 104 on an upper side of the fan frame 100. When the fan is started, the LED 102 emits light onto a surface of the rotating blade assembly 106, and the blade assembly 106 reflects the light with a sparkling effect, which shows the fan operates normally. Once the blade assembly 106 stops, the sparking effect will immediately stop. Although the conventional fan structure can indeed improve the shortcoming of not being able to immediately inspect the fan's failure when the power indicator and the fan rotation indicator operate normally, the conventional fan frame 100 still has the following shortcomings:

(1) Since the LED 102 cannot be securely fixed in the hole 101, it needs an adhesive to securely hold tight the LED 102 into the hole 101. Hence, its assembling time, as well as the manufacturing cost are increased; and (2) When the LED 102 malfunctions, the entire fan frame 100 has to be replaced with a new one, since the LED 102 cannot be easily taken out for replacement, and it is not a cost-effective measure.

To overcome the above-mentioned disadvantages, it is necessary to provide a fan frame that is able to allow a malfunctioned LED to be replaced with a new one.

SUMMARY OF THE INVENTION

A first objective of the present invention is to provide a fan frame with at least one LED mounted thereon, which does not need adhesive for installation, so as to make its assembling simpler and reduce its assembling time, thereby reducing its manufacturing cost.

A second objective of the present invention is to provide a fan frame with at least one LED mounted thereon, so when the LED malfunctions, only the LED, instead of the entire fan frame, shall be replaced with a new one. Therefore, its maintenance cost can be greatly reduced.

A third objective of the present invention is to provide a fan frame with at least one LED mounted thereon, which has the function of inspecting the rotation status of the blade assembly of a fan. When the LED emits light onto the surface of the blade assembly of a fan, the blade assembly reflects the light with a sparkling effect, which shows the fan is in normal operation. When there is no sparkling effect, it means the fan stops.

To achieve the above-mentioned objectives, the fan frame, which is embodied with a blade assembly and a motor therein in accordance with the present invention, has at least one LED socket mounted on a side thereof and having a hole and at least one snapping retention extended from both sides of the hole, and at least one LED snapped in its corresponding LED socket, wherein the snapping retention clips the rear portion of the LED after it is inserted into the hole.

The present invention will be easier to understand by reading the following detailed description of the preferred embodiment with reference to the attached drawings as follows:

DETAILED DESCRIPTION OF THE PREFERRED EMBODIMENT

Figure 1:
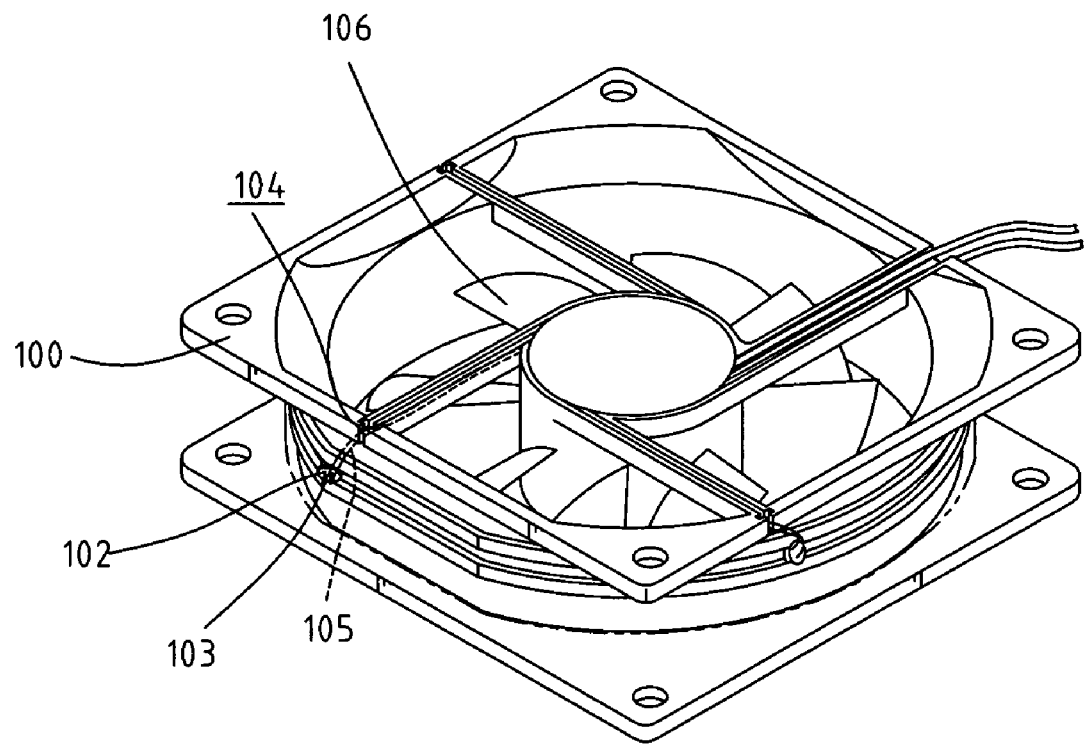
FIG. 1 is a perspective view of a fan frame with a LED mounted thereon in accordance with a prior art.
Figure 2:
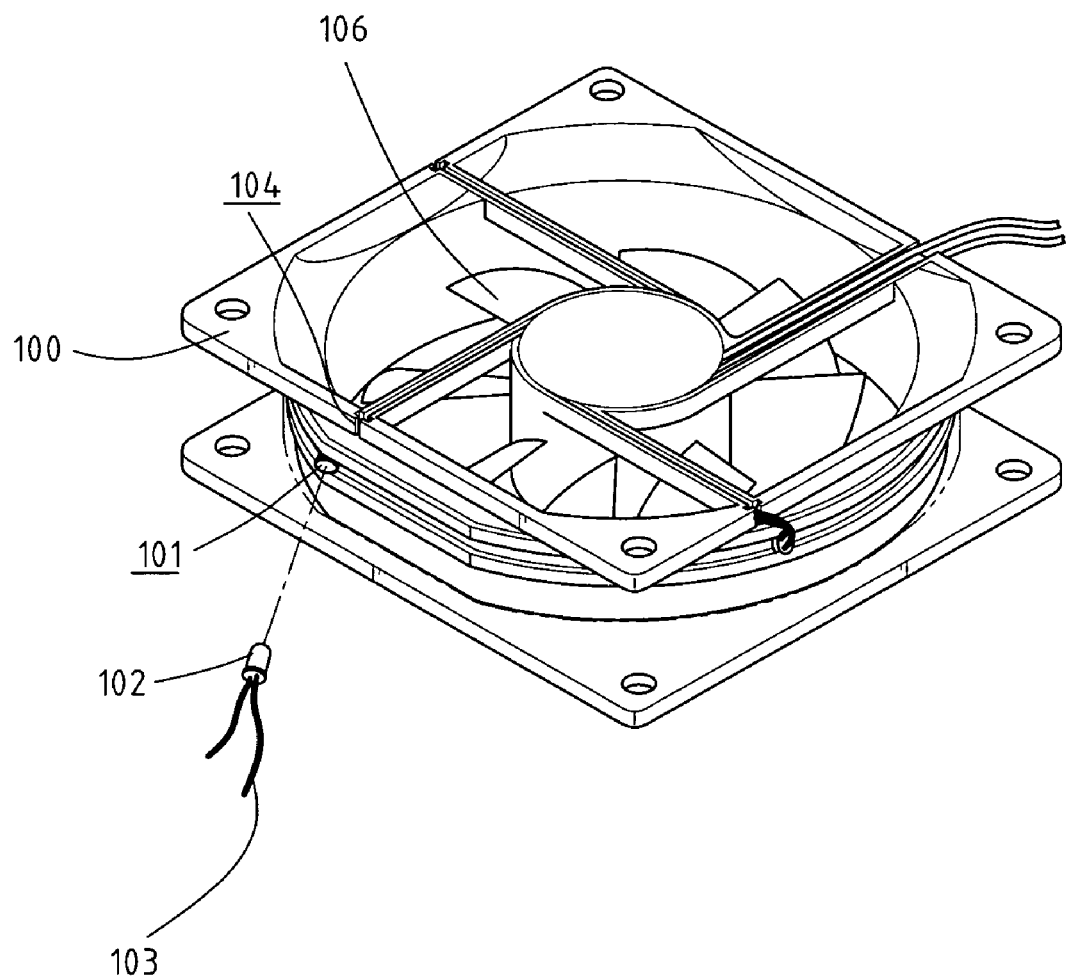
FIG. 2 is a perspective view that shows the disassembled LED from the conventional fan frame of FIG. 1.
Figure 3:
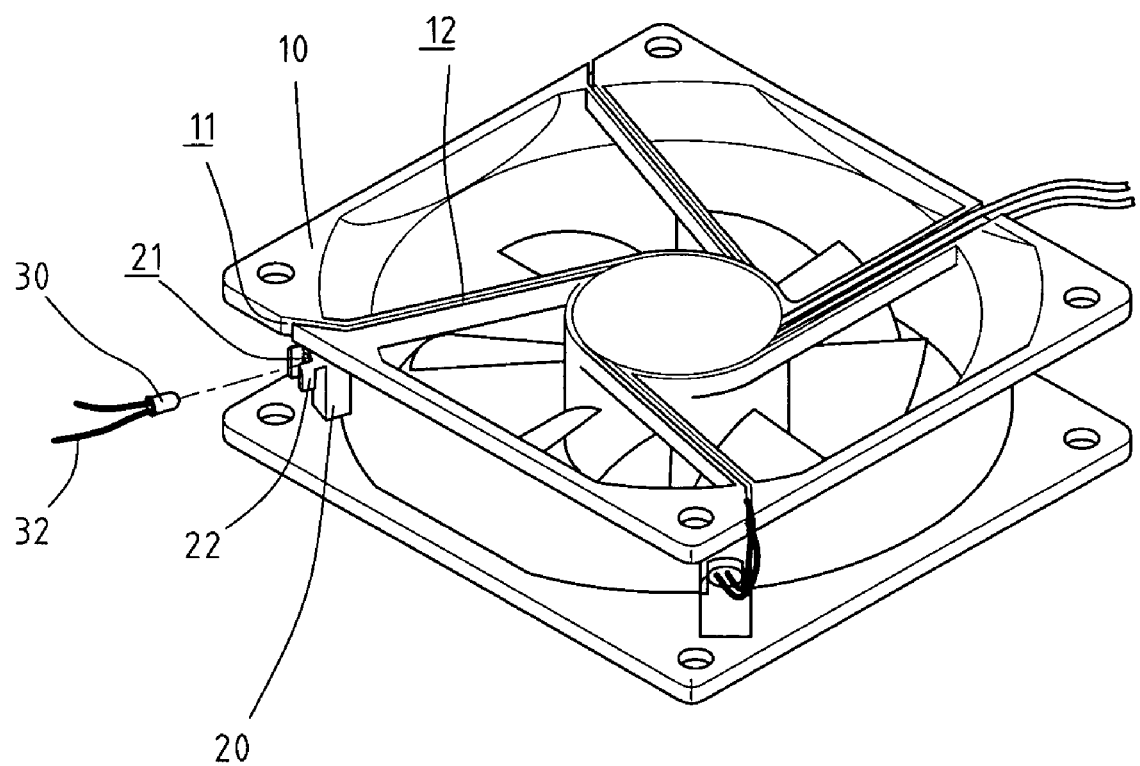
FIG. 3 is a perspective view of a fan frame with a LED mounted thereon in accordance with the present invention.
Figure 4:
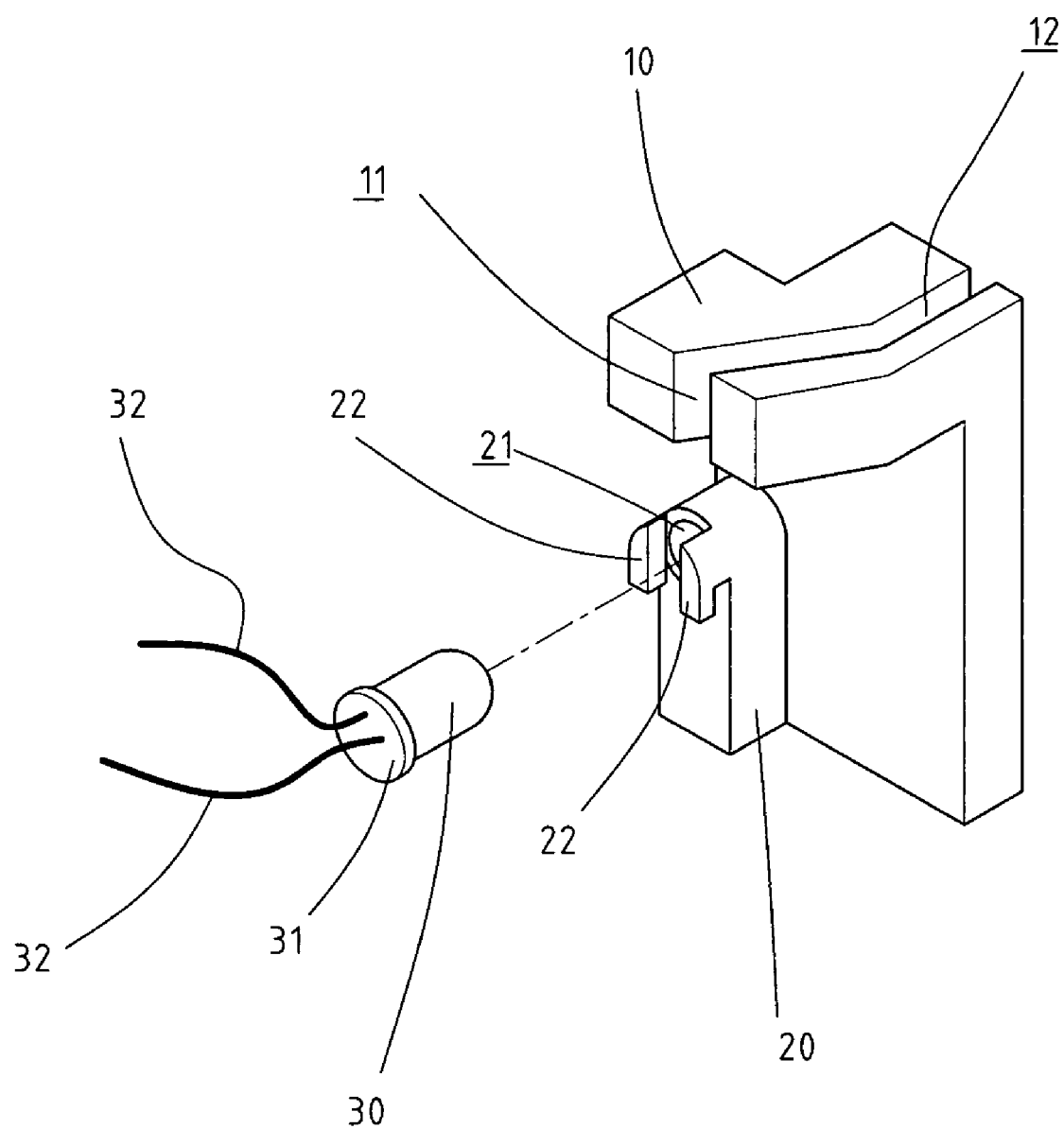
FIG. 4 is a partially enlarged perspective view of FIG. 3, which shows the relationship between the LED socket and the LED.

With reference to FIGS. 3 and 4, a fan frame 10, which is embodied with a blade assembly and a motor therein, in accordance with the present invention, has at least one cutout 11 and LED socket 20 on a side, and a connecting slot 12 on an upper side of the fan frame 10.

The LED socket 20 has a hole 21 and at least one set of snapping retention 22 which extends from both sides of the hole 21 and then bends downwards to form an L-shaped retention arm. The snapping retention 22 is made of resilient material.

A light emitting diode (LED) 30 has a larger rear portion 31 and two pin wires 32 extending from the rear portion 31 of the LED 30. The snapping retention 22 securely clips the rear portion 31 of the LED 30 after it is inserted into the hole 21 of the LED socket 20.

Figure 5:
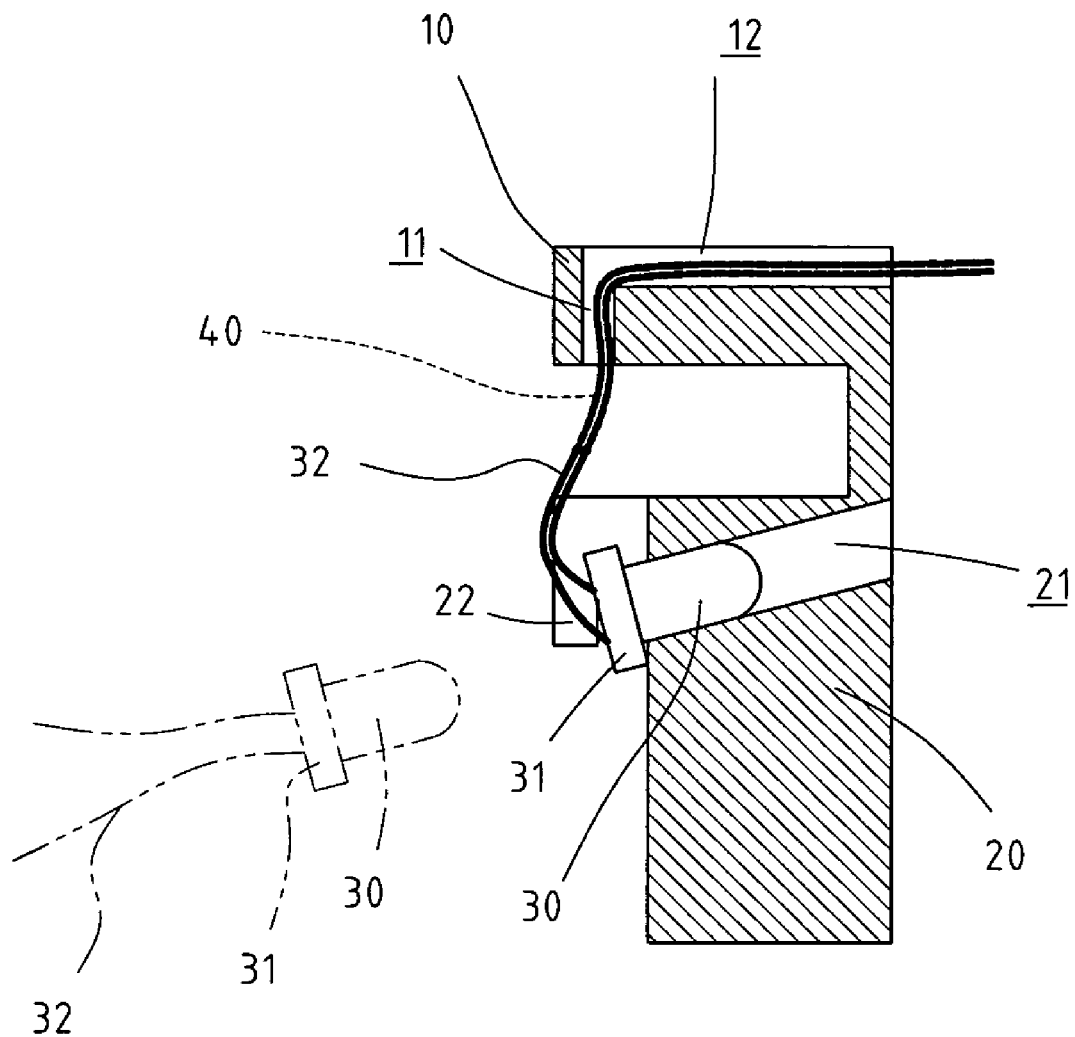
FIG. 5 is a cross sectional view of FIG. 4, showing that the LED is installed into the hole on the LED socket of the fan frame of the present invention.

With reference to FIG. 5, when assembling, a front portion of the LED 30 is inserted into the hole 21 with its rear portion 31 exposed outside the hole 21. Then, the L-shaped snapping retention 22 clips the rear portion 31 of the light emitting diode 30. Thereafter, the two pin wires 32 are connected to the lead wire 40, which is embedded in the slot 12 and inserted in the cutout 11.

From the above description, the snapping retention securely clips the LED 30 after it is inserted into the hole 21 of the LED socket 20; therefore it is no need to use adhesive to hold the LED 30. In addition, only the LED 30 instead of the entire fan frame 10 shall be replaced with a new one, when the LED 30 malfunctions. As a result, the maintenance cost can be greatly reduced.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A fan frame, which is embodied with a blade assembly and a motor therein, having at least one LED socket mounted on a side thereof and having a hole and at least one set of snapping retention extended from both sides of the hole, and at least one light emitting diode located in its corresponding LED socket, wherein the snapping retention clips the rear portion of the light emitting diode after it is inserted into the hole.

2. The fan frame as claimed in claim 1, wherein at least one set of snapping retention extends from a surface of the LED socket and then bends downwards to form an L-shaped retention arm.

3. The fan frame as claimed in claim 1, wherein the snapping retention is made of resilient material.

4. The fan frame as claimed in claim 1, wherein the light emitting diode has a larger rear portion.

5. The fan frame as claimed in claim 1, wherein the fan frame forms at least one cutout on the side to connect with a corresponding slot on an upper side of the fan frame, and the light emitting diode has two pin wires in the rear portion and connects with a lead wire, which is embedded in the slot and inserted in the cutout.

* * * * *